United States Patent [19]

Feng et al.

[11] 3,966,514
[45] June 29, 1976

[54] METHOD FOR FORMING DIELECTRIC ISOLATION COMBINING DIELECTRIC DEPOSITION AND THERMAL OXIDATION

[75] Inventors: Bal-Cwo Feng, Wappingers Falls; George Cheng-Cwo Feng, Poughkeepsie, both of N.Y.

[73] Assignee: IBM Corporation, Armonk, N.Y.

[22] Filed: June 30, 1975

[21] Appl. No.: 592,014

[52] U.S. Cl. ............................. 148/187; 148/175; 357/49
[51] Int. Cl.² ..................................... H01L 21/308
[58] Field of Search ............... 148/1.5, 187; 357/49

[56] References Cited
UNITED STATES PATENTS

| | | | |
|---|---|---|---|
| 3,681,153 | 8/1972 | Clark et al. ......................... | 148/187 |
| 3,755,001 | 8/1973 | Kooi et al. ......................... | 148/187 X |
| 3,783,047 | 1/1974 | Paffen et al. ........................ | 148/187 |
| 3,793,090 | 2/1974 | Barile et al. ........................ | 148/187 X |
| 3,886,000 | 5/1975 | Bratter et al. ....................... | 148/187 X |

*Primary Examiner*—L. Dewayne Rutledge
*Assistant Examiner*—J. Davis
*Attorney, Agent, or Firm*—J. B. Kraft

[57] ABSTRACT

In the fabrication of integrated circuits, a method is provided for forming recessed silicon dioxide isolation in which the "bird's beak" problem associated with conventional silicon dioxide-silicon nitride composite masking structures is minimized. A conventional composite mask comprising a bottom layer of silicon dioxide and an upper layer of silicon nitride having a plurality of openings defining the regions in the silicon substrate which are to be thermally oxidized is formed on the substrate. Recesses are then etched in the silicon substrate in registration with the openings in the composite mask. The silicon dioxide layer should be, in effect, over-etched to extend the openings in the silicon dioxide to greater lateral dimensions than the openings in the silicon nitride layer whereby the silicon nitride layer at the periphery of the openings is undercut.

A layer of a material capable of blocking the oxidation of silicon and having a greater etchability than silicon nitride is then deposited in said recesses and covering said undercut portions of said silicon nitride masks. At this point the structure is blanket etched to remove said blocking material from the portions of the recesses not under said silicon nitride and to, thereby, expose the silicon in these portions. Finally, the structure is thermally oxidized so that the exposed silicon in the recesses oxidizes to form recessed regions of silicon dioxide substantially coplanar with the unrecessed regions of the silicon substrate. Because of the undercutting and the deposition in the undercut portions of the recesses of the blocking material, the "bird's beak" effect is minimized.

6 Claims, 4 Drawing Figures

METHOD FOR FORMING DIELECTRIC ISOLATION COMBINING DIELECTRIC DEPOSITION AND THERMAL OXIDATION

BACKGROUND OF THE INVENTION

In recent years, silicon nitride masks have become a sought-after expedient in the fabrication of integrated circuits. Originally, the art applied masking layers comprising silicon nitride directly onto silicon substrates. This gave rise to problems associated with high stresses created on the underlying silicon substrate by the silicon nitride-silicon interface. Such stresses were found in many cases to produce dislocations in the silicon substrate which appear to result in undesirable leakage current pipes and otherwise adversely affect the electrical characteristics of the interface. In order to minimize such interface stresses with silicon nitride layers, it has become the practice in the art to form a thin layer of silicon dioxide between the silicon substrate and the silicon nitride layer. While this approach has been relatively effective in the cases where this silicon dioxide-silicon nitride composite is utilized only for passivation, problems have arisen where these silicon dioxide-silicon nitride composites have been utilized as masks, and, particularly, when utilized as masks against thermal oxidation. During such thermal oxidation, there is a substantial additional lateral penetration of silicon oxide from the thermal oxidation beneath the silicon nitride. This lateral penetration is greatest at the mask-substrate interface to provide a laterally sloping structure known and recognized in the prior art as the undesirable "bird's beak."

The publications, "Local Oxidation of Silicon; New Technological Aspects," by J. A. Appels et al, Phillips Research Report 26, pp. 157 – 165, June 1971, and "Selective Oxidation of Silicon and Its Device Application," E. Kooi et al, Semiconductor Silicon 1973, published by the Electrochemical Society, Edited by H. R. Huff and R. R. Burgess, pp. 860 – 879, are representative of the recognition in the prior art of the "bird's beak" problems associated with silicon dioxide-silicon nitride composite masks.

The "bird's beak" problems are particularly significant when silicon dioxide-silicon nitride composite masks are used in the formation of recessed silicon dioxide to be used for dielecric isolation. In such recessed oxide formation techniques, the silicon dioxide-silicon nitride composite masks are first used as an etch barrier while recesses are etched through the mask openings in the silicon substrate. These recesses are subsequently subjected to the previously described thermal oxidation to form recessed silicon dioxide regions providing dielectric isolation extending into the silicon substrate from the surface. Such recessed silicon dioxide regions would be most desirably coplanar with the remainder of the silicon surface. However, as a result of the "bird's beak," a lateral junction or edge of the recessed silicon dioxide isolation region is very vaguely defined. With any recessed oxide isolation it is highly desirable that the lateral edges of the recessed silicon dioxide be substantially vertical, i.e., perpendicular to the semiconductor substrate surface. Instead, as a result of the "bird's beak", the edges of the recessed silicon dioxide are gradually sloped with respect to the silicon surface, being at an angle which varies from 15° to 30° with respect to the surface instead of the desirable 90° angle.

Because of this gradual lateral junction in the recessed silicon dioxide, the recessed area does not clearly define abutting regions introduced by either diffusion or ion implantation, particularly shallow abutting regions. In the case of such shallow abutting regions, there is a distinct possibility that during subsequent etching steps part of the "bird's beak" at the surface will be etched away to provide an undesirable exposure of the P-N or other junction of the abutting shallow region.

However, even with deeper regions formed by diffusion, the indefiniteness of the lateral junction of the abutting recessed silicon dioxide region renders it difficult to control lateral geometries of introduced region, and therefore imposes the need for wider tolerances of lateral dimension in the integrated circuit layout.

The above mentioned lack of definition because of the "bird's beak" is particularly pronounced when the recessed silicon dioxide regions abutting the silicon region are utilized to define a region of a given conductivity type introduced into a silicon substrate region adjoining such recessed silicon dioxide regions. In such a case, one of the significant advantages of recessed oxide technology as taught in the prior art is the ability to eliminate precise mask alignment steps when introducing said conductivity-type region. In accordance with the art, it is desirable to first cover the surface of the substrate with a layer of an insulative material, particularly silicon dioxide, after which a step involving only very gross masking coupled with dip etching is utilized to avoid such mask alignment when forming openings in the silicon dioxide layer through which the conductivity-determining impurities are to be introduced into the silicon substrate. The dip etching process is continued for a time calculated to be sufficient to remove only the deposited silicon dioxide layer from the surface of selected silicon substrate region (the selection of regions is of course determined by the gross block-out mask) but insufficient to affect the surrounding recessed silicon dioxide region. However, because of the "bird's beak," the extent of such surrounding recessed oxide regions, particularly at the substrate surface, becomes indefinite and the portion of the silicon substrate exposed may vary substantially dependent on the extent of the "bird's beak." Thus, because of the variation in opening size, the introduced region may vary substantially in lateral dimension.

Because of this variation of lateral dimensions, contact openings made to such introduced regions through subsequently formed insulative layers cannot be made with any definiteness or precision because such contact opening may expose a surface junction between the introduced region and an abutting region of semiconductor material. Accordingly, an additional advantage of recessed silicon dioxide technology, i.e., that of defining contact opening to abutting regions formed in the substrate is also unrealized.

SUMMARY OF THE PRESENT INVENTION

Accordingly, it is an object of the present invention to provide a method of integrated circuit fabrication which utilizes recessed oxide regions to define regions of selected conductivity-type introduced into the substrate wherein the definition of the introduced region is substantially unaffected by "bird's beak" problems.

It is another object of the present invention to provide a method of integrated circuit fabrication utilizing recessed silicon dioxide regions to at least partially define the electrical contact openings and contacts made to abutting regions of selected conductivity-type introduced into the substrate wherein the nature of such electrical contacts are substantially unaffected by "bird's beak" problems.

It is a further object of the present invention to provide a method for integrated circuit fabrication utilizing recessed silicon dioxide dielectric isolation which is substantially free of the problems of exposed junctions between regions of different conductivity at the surface of the silicon substrate during the formation of electrical contact openings into the substrate.

In accordance with the method of the present invention, in the formation of integrated circuits, dielectrically isolated regions in a silicon substrate may be formed by the steps of forming a layer of silicon dioxide on the surface of the substrate, and then forming a masking layer of silicon nitride having a plurality of openings on said silicon dioxide layer. A plurality of openings through the masked silicon dioxide layer are then etched wherein the openings on registration with and have greater lateral dimensions than the silicon nitride mask openings. Therefore, the silicon dioxide layer openings undercut the silicon nitride at the periphery of the mask openings.

A plurality of recesses in the silicon substrate are etched respectively in registration with the openings through the composite silicon dioxide-silicon nitride masking layers. Then, a layer of a material capable of blocking the oxidation of silicon and having a greater etchability than silicon nitride is deposited in the recesses covering the undercut portions of the silicon nitride mask. An excellent oxidation blocking material having the above-described properties is silicon oxynitride. The silicon oxynitride has the property of blocking thermal oxidation of silicon. In addition, silicon oxynitride is more etchable than silicon nitride in selected chemical solvents such as, buffered hydrofluoric acid. Alternatively, the silicon oxynitride has a substantially greater rate of etchability in conventional sputter etching, such as, RF sputter etching and may be selectively removed by said sputter etching techniques with the silicon nitride effectively acting as a barrier. Another blocking material having similar properties is aluminum oxide.

Then, the blocking material is removed by either chemical or RF sputter etching from the portions of said recesses not under said silicon nitride to expose the silicon in such portions, and the structure is then thermally oxidized to oxidize the exposed silicon in the recesses to form regions of recessed silicon dioxide substantially coplanar with the unrecessed portions of the silicon substrate.

It appears that the "bird's beak" effect is normally associated with the presence of silicon dioxide in the critical areas where the "beak" tends to occur during thermal oxidation step. By eliminating the silicon dioxide from these areas by undercutting and by covering any remaining silicon dioxide with an oxidation blocking material, such as, silicon oxynitride, and by further covering the silicon in the recesses abutting this critical area with the silicon oxynitride so that no silicon dioxide can initially be formed there, the present invention minimizes the "bird's beak" effect.

The foregoing and other objects, features and advantages of the invention will be apparent from the following more particular description of the preferred embodiments of the invention as illustrated in the accompanying drawings.

DESCRIPTION OF THE PREFERRED EMBODIMENT

Figure 1:
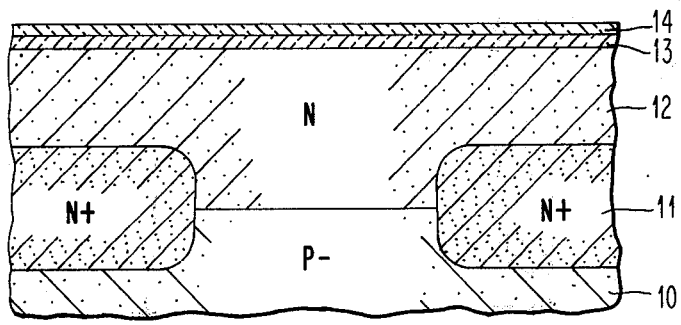
FIGS. 1-8 are diagrammatic sectional views of a portion of an integrated circuit in order to illustrate the method of the preferred embodiments of the present invention.

With reference to the figures, in the formation of the structure shown in FIG. 1, the suitable wafer 10 of P-material, i.e., a silicon substrate having a resistivity of 10 ohm-cm, N+ regions 11 are formed utilizing conventional impurity introduction techniques. The region may be formed by any convention ion implantation or thermal diffusion of impurities such as, phosphorus, arsenic, antimony or the like to an N+ surface concentration of $10^{21}$ atoms/cm$^3$. Then, there is formed on substrate 10 an N-type epitaxial layer 12 having a maximum impurity concentration or doping level of about $10^{16}$ atoms/cm$^3$ by conventional epitaxial deposition technique having a temperature in the order of 950° to 1150°C over a period of from 15 to 30 minutes. During the deposition of epitaxial layer 12, regions 11 are outdiffused partially up into the epitaxial layer. The epitaxial layer has a thickness in the order of from 1 to 4 microns, depending on the overall specification of the integrated circuits. For purposes of this invention, the thickness of the epitaxial layer may be considered in the order of 2 microns. The epitaxial layer may be formed using conventional apparatus and method as described in U.S. Pat. No. 3,424,629.

Still with reference to FIG. 1, a layer of silicon dioxide 13 is then formed on the surface of epitaxial layer 12. Layer 13 may be formed by any conventional thermal oxidation technique or it may be deposited by conventional vapor deposition techniques. Next, a layer comprising silicon nitride 14 having a thickness in the order of 1000 A is deposited over the entire structure shown. The silicon nitride can be formed by any conventional technique such as the chemical vapor deposition reaction of silane and ammonia. This reaction is normally carried out at a temperature in the order of 1000°C. Alternatively, silicon nitride layer 14 may be deposited by conventional RF sputter deposition techniques.

Figure 2:
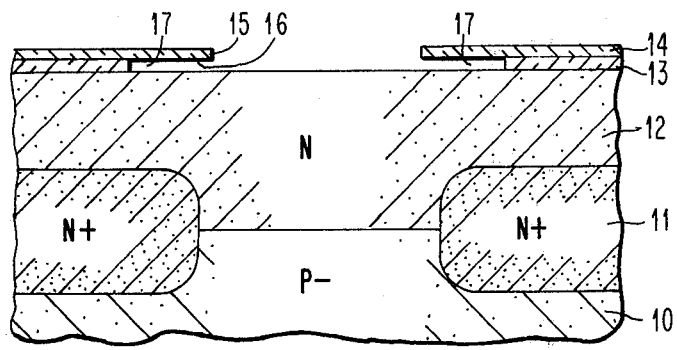

Next, with reference to FIG. 2, utilizing standard photolithographic etching techinques openings 15 are etched through silicon nitride layer 14 in a pattern corresponding to the regions of recessed silicon dioxide isolation to be subsequently formed in the substrate. One conventional technique for etching openings 15 through the silicon nitride layer involves forming by standard photoresist methods a deposited silicon dioxide mask (not shown) over silicon nitride layer 14 defining openings 15, and etching with a suitable etchant for silicon nitride, such as, hot phosphoric acid or hot phosphoric salt. The silicon dioxide mask (not shown) for the silicon nitride layer is then removed leaving the openings 15 as shown in FIG. 2. Then, FIG. 2, utilizing suitable conventional photoresist techniques, openings 16 are etched through silicon dioxide layer 13. A suitable etchant for this silicon dioxide is the conventional buffered hydrofluoric acid etch. The etching is continued for a period sufficient to extend the lateral dimensions of openings 16 in silicon dioxide layer 13 so as to undercut silicon nitride layer 14 in regions 17. For example, in the case of openings 15 through silicon nitride layer 14 having dimensions in the order of 2 microns in diameter, the lateral extent of the undercut in region 17 is in the order of 5000 A from the edge of opening 15 to produce the resulting structure shown in FIG. 2.

It should be noted that the structure being shown and described is only a small portion of an integrated circuit and is intended to illustrate how the method of the present invention is operable to fabricate recessed silicon dioxide regions which dielectrically isolates regions in the silicon substrate except for the method of undercutting and the deposition of the layer of oxidation blocking material, the techniques utilized to form the recessed silicon dioxide dielectrically isolated integrated circuit are substantially described in U.S. Pat. No. 3,858,231.

Figure 3:
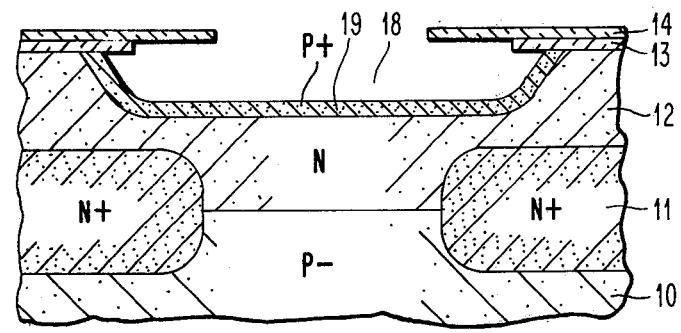

Then, as shown in FIG. 3, the composite of silicon dioxide mask 13 and silicon nitride mask 14 is utilized, and epitaxial layer 12 is partially etched away in regions 18, utilizing a conventional etchant for silicon, such as, a composition of nitric acid and diluted hydrofluoric acid. Recesses 18 are about 0.4 to 0.5 microns in depth resulting in the mesa-like structure shown. It should be noted that, as a result of this etching step, recesses 18 undercut the composite mask, i.e., have greater lateral dimensions than registered openings 15 and 16. For recesses in the order of 0.5 microns in depth, the lateral undercut on an opening edge will be in the order of 10,000 A from the edge of silicon nitride mask opening 15.

At this stage, after recesses 18 are formed, surface P+ guard ring 19 may be optionally formed along the parimeter of the recess in which the dielectric isolation is to be formed. Region 19 may be formed in any conventional manner by a blanket surface diffusion or ion implantation of a P-type impurity such as, boron to a $C_o$ in the order of $1 \times 10^{20}$ atoms/cm$^3$. Region 19 is optional in its prime purpose is a conventional one, i.e., preventing any leakage along the interface of a subsequently formed recessed dielectric region and device regions subsequently to be formed in the epitaxial layer which abutt such dielectric isolation region. Alternatively, region 19 may be totally omitted.

Figure 4:
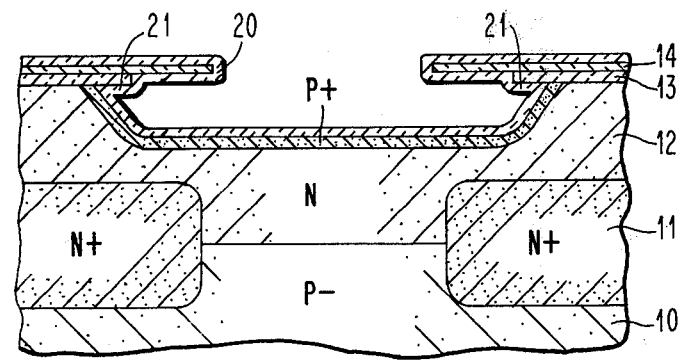

Now, with reference to FIG. 4 utilizing conventional chemical vapor deposition techniques, a layer 20, 1,000 A of thickness, the silicon oxynitride is deposited over the entire structure as shown. This layer includes a portion 21 deposited in the undercut portions of silicon nitride layer 15 and silicon dioxide layer 16.

Silicon oxynitride layer 20 may be deposited by any conventional chemical vapor deposition technique for growing a silicon oxynitride. For example, it may be formed by the reaction of silane, ammonia and carbon dioxide in a hydrogen carrier gas and deposited in conventional apparatus at a deposition temperature from 850°C to 1000°C. One method for the deposition of the oxynitride is described on page 3888 in the May 1973 (Volume 15, No. 12) issue of the IBM Technical Disclosure Bulletin. By controlling the ratio of carbon dioxide to ammonia in the method set forth in the IBM Technical Disclosure Bulletin, the index of refraction of layer 20 of silicon oxynitride may be controlled. Detail of controlling this index of refraction is set forth in U.S. Pat. No. 3,886,000. Since, as will be subsequently described in greater detail, the effectiveness of the present process is related to the difference in etchability between silicon nitride and silicon oxynitride, best results may be achieved by forming silicon oxynitride having a refractive index on greater than 1.74. Silicon oxynitride compositions having refractive indexes above 1.74 have etch rates closer to that of silicon nitride thus making the subsequent selective removal of silicon oxynitride from the nitride more difficult.

Figure 5:
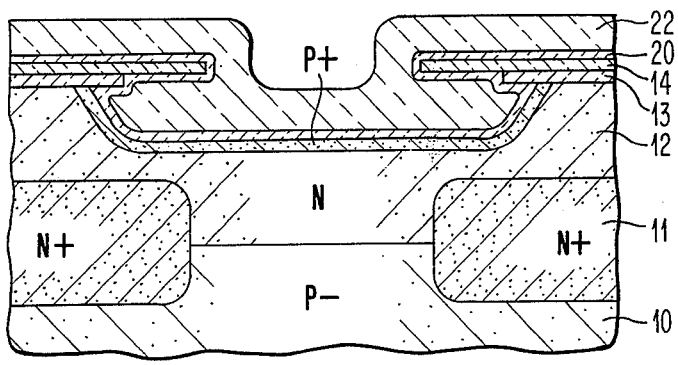
Figure 5:
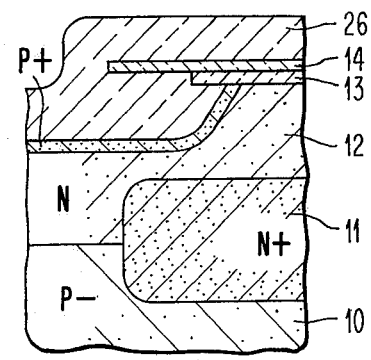
Figure 6:
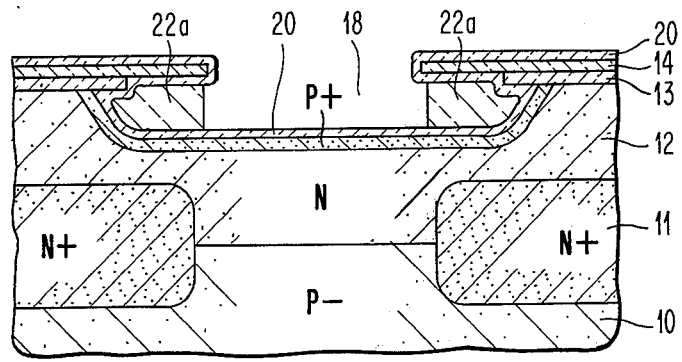

Next, FIG. 5, utilizing any conventional chemical vapor deposition or even RF sputter deposition technique, a layer of silicon dioxide 22, about 5,000 A in thickness is deposited over the entire structure. Next, FIG. 6, the structure is subjected to sputter etching which is conducted in a conventional manner at reduced atmospheric pressure in glow discharge apparatus. A typical apparatus and method for achieving such sputter etching is described in U.S. Pat. No. 3,589,710. The etching is conducted for a period of time sufficient to remove all of the silicon dioxide layer except for the pocket 22a remaining in recesses 18 under silicon nitride layer 14. Because silicon oxynitride layer 20 has a lower sputter etch rate than silicon dioxide, the sputter etching may be carried out for a period sufficient to insure the exposure of silicon oxynitride layer 20 in the bottom of the recess. Instead of removing silicon dioxide layer 22 by sputter etching, it may be removed by a suitable solvent such as buffered HF which etches silicon dioxide at a substantially greater rate than it does the underlying silicon oxynitride.

Figure 7:
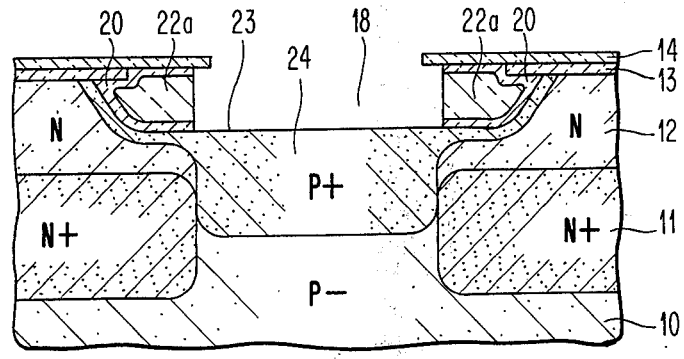

Then, FIG. 7, utilizing an etchant which selectively etches silicon oxynitride layer 20 at a substantially greater rate than it would etch silicon nitride layer 14, e.g., a conventional buffered hydrofluoric acid etchant, silicon oxynitride layer 20 is removed from the bottom of recess 18 to expose surface 23 of epitaxial layer 12. The oxynitride layer 20 is also removed from the upper surface of the structure and remain only in place in the portions of the recess shown under silicon nitride layer 14. During this step, silicon dioxide pockets 22a remaining in the recess which are relatively etchable in silicon nitride are etched back to some extent as shown. In this step the remaining silicon dioxide pockets 22a serve the function of preventing the complete removal of the portions of silicon oxynitride layer 20 under the silicon nitride layer 22. In addition, the remaining silicon dioxide pockets will serve the subsequent function of preventing voids in the corners of recesses 18 under nitride layer 14 when the silicon dioxide is subsequently grown by thermal oxidation as will be hereinafter described.

Alternatively, the step in FIG. 7 may be carried out by removing silicon oxynitride layer 20 from the bottom of recesses 18 by RF or other sputtering approaches. Since silicon nitride has a substantially lower sputter etch rate than does silicon oxynitride, layer 20 may be removed as shown in FIG. 7 without substantially effecting the underlying silicon nitride layer 14.

In addition, with respect to FIG. 7, there is another optional operation which may be performed at this point and is shown in FIG. 7. If junction isolation is to be utilized beneath the lateral dielectric isolation as is conventional in many integrated circuits employing dielectric isolation, at this point, the P+ impurities forming a P+ isolation region 24 may be introduced into the silicon substrate below surface 23 exposed in recess 18. The conductivity determining impurity to form P+ region 24 may be a material, such as, boron or gallium having an approximate $C_o$ of $5 \times 10^{19}$ atoms/cm$^3$. However, this step is entirely optional and may be omitted without effecting the method of the present invention.

Figure 8:
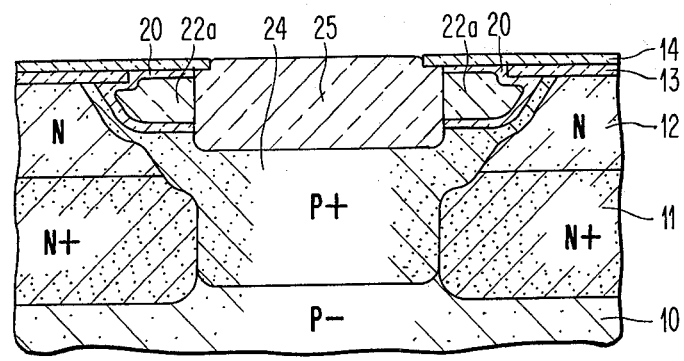
Figure 8:
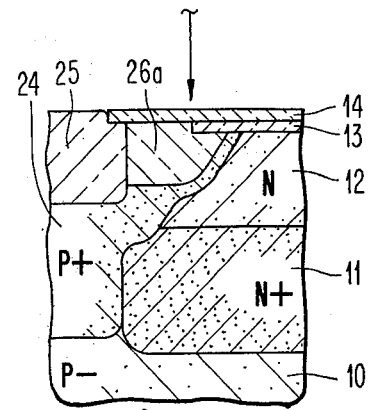

At this stage, FIG. 8, the structure is put through an oxidation cycle where it is placed in an oxidation atmosphere at an elevated temperature in the order of 970° to 1100°C with the addition of water vapor to produce thermally grown silicon dioxide region 25 grown from the exposed silicon surface 23 to fill in the structure and thus complete the dielectric isolation.

In a variation of the approach described, instead of the structure described with respect to FIGS. 4 and 5 wherein a relatively thin layer of silicon oxynitride 20 is used in combination with a substantially thicker layer of chemical vapor deposited silicon dioxide 22, there may be used as shown in FIG. 5' a single deposited layer silicon oxynitride 26 having a greater thickness in the order of 6,000 A. With such an alternative structure, a similar procedure to that described may be carried out so as to selectively remove silicon oxynitride layer 26 to expose the silicon surface in the recesses while leaving silicon nitride layer 14 in tact because of the above-described lower etch rate of the silicon nitride layer 14 in either selected chemical solvents or in an RF sputter etching systems. The resulting structure is shown in FIG. 8' wherein pockets of the silicon oxynitride 26a remain in place in the corner of the recesses under the remaining silicon nitride layer 14.

While the invention has been specifically described utilizing silicon oxynitride as the oxidation blocking material, it should be understood that other material such as aluminum oxide which act to block the oxidation of silicon while being more etchable than silicon nitride may be utilized in place of the silicon oxynitride to achieve the results of the present invention. A key factor in the present invention is the maintainence of the oxidation blocking layer in place surrounding the cut back silicon dioxide layer and blocking the corner of the silicon recesses abutting this silicon dioxide layer during the thermal oxidation step so that the "bird's beak" effect is minimized. As a result, the lateral edges of the recessed dielectric isolation regions in accordance with the present invention are relatively steep thereby solving the various edge definition problems presented by the gradually sloped "bird's beak" structure.

While the invention has been particularly shown and described with reference to the preferred embodiments thereof, it will be understood by those skilled in the art that various changes in form and details may be made therein without departing from the spirit and scope of the invention.

What is claimed is:

1. In the fabrication of integrated circuits, a method for forming dielectrically isolated regions in a silicon substrate comprising:
    forming a layer of silicon dioxide on a surface of the substrate,
    forming a masking layer of silicon nitride having a plurality of openings on said silicon dioxide layer,
    etching a plurality of openings through the masked silicon dioxide layer in registration with the silicon nitride mask openings; said silicon dioxide layer openings having greater lateral dimensions than the silicon nitride openings and, thus, undercut the silicon nitride at the periphery of said mask openings,
    etching a plurality of recesses in the silicon substrate respectively in registration with the openings through the silicon dioxide and silicon nitride layers,
    depositing a layer of a material capable of blocking the oxidation of silicon and having greater etchability than silicon nitride in said recesses covering said undercut portions of said silicon nitride masks,
    etching to remove said blocking material from the portions of said recesses not under said silicon nitride to expose the silicon in said portions, and
    thermally oxidizing the exposed silicon in said recesses to form regions of recessed silicon dioxide substantially coplanar with the unrecessed portions of the silicon substrate.

2. The method of claim 1 wherein said oxidation blocking material is silicon oxynitride.

3. The method of claim 2 wherein said silicon oxynitride has a maximum index of refraction of 1.74.

4. The method of claim 3 wherein said etching to remove said silicon oxynitride is chemical etching in a solvent in which said silicon oxynitride has a greater etch rate than said silicon nitride.

5. The method of claim 2 wherein said etching is sputter etching, and said silicon oxynitride has a greater sputter etch rate than has said silicon nitride.

6. The method of claim 2 further including the step of introducing conductivity determining impurities into the silicon exposed in said recesses prior to the step of thermally oxidizing said exposed silicon.

* * * * *